(12) United States Patent
Tateyama et al.

(10) Patent No.: US 11,444,516 B2
(45) Date of Patent: Sep. 13, 2022

(54) ELECTRONIC CONTROL DEVICE

(71) Applicant: HITACHI AUTOMOTIVE SYSTEMS, LTD., Hitachinaka (JP)

(72) Inventors: Tetsurou Tateyama, Hitachinaka (JP); Kumiko Yoshinaga, Hitachinaka (JP); Eiji Ichikawa, Hitachinaka (JP); Hirofumi Watanabe, Hitachinaka (JP); Mototaka Takahashi, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 260 days.

(21) Appl. No.: 16/957,882

(22) PCT Filed: Dec. 28, 2018

(86) PCT No.: PCT/JP2018/048413
§ 371 (c)(1),
(2) Date: Jun. 25, 2020

(87) PCT Pub. No.: WO2019/131991
PCT Pub. Date: Jul. 4, 2019

(65) Prior Publication Data
US 2020/0321839 A1  Oct. 8, 2020

(30) Foreign Application Priority Data

Dec. 28, 2017 (JP) .............................. JP2017-253047
Dec. 27, 2018 (JP) .............................. JP2018-243938

(51) Int. Cl.
*H02K 11/33* (2016.01)
*H05K 1/02* (2006.01)

(52) U.S. Cl.
CPC ............. *H02K 11/33* (2016.01); *H05K 1/028* (2013.01)

(58) Field of Classification Search
CPC ........... H02K 11/33; H05K 1/028; H05K 1/02
(Continued)

(56) References Cited

U.S. PATENT DOCUMENTS

| 4,812,135 A | 3/1989 | Smith |
| 4,832,621 A | 5/1989 | Asai et al. |

(Continued)

FOREIGN PATENT DOCUMENTS

| JP | H3-56166 U | 5/1991 |
| JP | 2007-273981 A | 10/2007 |

(Continued)

OTHER PUBLICATIONS

International Search Report issued in corresponding application No. PCT/JP2018/048413 dated Mar. 19, 2019 with English translation.

(Continued)

*Primary Examiner* — Tremesha S Willis
(74) *Attorney, Agent, or Firm* — Foley & Lardner LLP

(57) ABSTRACT

A wiring board (3) has first and second rigid sections (11, 12) each having six metal leaf layers, and a flexible section (13) having two metal leaf layers that connect the both rigid sections (11, 12). A capacitor unit (34) and a filter unit 31, which supplies power to an inverter, are mounted on the first rigid section (11), and a CPU (21) and a pre-driver circuit element (22) are mounted on the second rigid section (12). Mutually-independent two control systems are arranged so as to be symmetrical about a board center line (M). Detection signal lines (51) of rotation sensors (37, 38) located at the middle of the first rigid section (11) extend along the board center line (M) on the flexible section (13). Each of the two control systems is configured along a wiring direction of the detection signal lines (51).

16 Claims, 10 Drawing Sheets

(58) Field of Classification Search
USPC .......................................................... 310/71
See application file for complete search history.

(56) References Cited

U.S. PATENT DOCUMENTS

| | | | |
|---|---|---|---|
| 5,224,023 | A | 6/1993 | Smith et al. |
| 2007/0227768 | A1 | 10/2007 | Shin |
| 2008/0285241 | A1 | 11/2008 | Hou et al. |
| 2008/0289859 | A1 | 11/2008 | Mikado et al. |
| 2009/0231816 | A1 | 9/2009 | Lin |
| 2015/0373830 | A1 | 12/2015 | Miyagawa et al. |
| 2016/0065037 | A1 | 3/2016 | Buerger |
| 2017/0217481 | A1 | 8/2017 | Asao |

FOREIGN PATENT DOCUMENTS

| | | | |
|---|---|---|---|
| JP | 2010-195219 A | 9/2010 | |
| JP | 2014-060903 A | 4/2014 | |
| JP | 2016-512948 A | 5/2016 | |
| JP | 2010-105640 A | 5/2020 | |
| WO | WO-2016/063367 A1 | 4/2016 | |

OTHER PUBLICATIONS

Written Opinion issued in corresponding application No. PCT/JP2018/048413 dated Mar. 19, 2019 with English translation.
International Search Report issued in corresponding application No. PCT/JP2018/048412 dated Mar. 19, 2019 with English translation.
Written Opinion issued in corresponding application No. PCT/JP2018/048412 dated Mar. 19, 2019 with English translation.
Non-Final Office Action on U.S. Appl. No. 16/957,895 dated May 25, 2021.
Decision of Dismissal of Amendment dated Feb. 1, 2022 issued in JP Application No. 2017-253047, with English translation, 9 pages.
Decision of Refusal dated Feb. 1, 2022 issued in JP Application No. 2017-253047, with English translation, 2 pages.
Notice of Allowance on U.S. Appl. No. 16/957,895 dated Apr. 27, 2022.
U.S. Office Action on U.S. Appl. No. 16/957,895 dated Dec. 14, 2021.
Notice of Reasons for Refusal dated Jun. 15, 2021 issued in JP Application No. 2017-253047, with English translation, 11 pages.

(1)

ELECTRONIC CONTROL DEVICE

TECHNICAL FIELD

The present invention relates to an electronic control device using a foldable multilayer wiring board that can be assembled in a housing with the multilayer wiring board being bent.

BACKGROUND ART

Patent Document 1 discloses, as a circuit board mounted in a motor unit of a power steering device, a circuit board that can be used with the circuit board being folded into a substantially U-shape by coupling a plurality of rigid board sections through a flexible bending section that is thinner than the rigid board sections.

In a case of the circuit board having such bending section, since the bending section formed partly thin is interposed between the rigid board sections, there is a risk that the circuit board as a whole will be subject to a limitation on a mounting layout and a wiring layout of electronic components. That is, there is a problem of how the mounting layout and the wiring layout of the electronic components including a detecting element such as a rotation sensor that detects an operating state of an electric actuator in a control system of the electric actuator should be determined.

CITATION LIST

Patent Document

Patent Document 1: Japanese Unexamined Patent Application Publication No. 2010-105640

SUMMARY OF THE INVENTION

According to the present invention, as one aspect of the present invention, a multilayer wiring board has first and second component mounting sections on which electronic components are mounted; a flexible section located between the first and second component mounting sections, wherein the flexible section has a structure in which the number of the wiring layers of the flexible section is smaller than those of the first and second component mounting sections and a board thickness of the flexible section is relatively thin as compared with the first and second component mounting sections, the flexible section has flexibility that is higher than those of the first and second component mounting sections by the structure of the flexible section; a detecting element mounted on the first component mounting section and configured to detect an operating state of the electric actuator; and detection signal lines formed at the wiring layer of the flexible section and configured to send signals of the detecting element from the first component mounting section to the second component mounting section. And, a group of electronic components mounted on the first component mounting section and a CPU mounted on the second component mounting section, which form one control system for the electric actuator, are arranged along a wiring direction of the detection signal lines.

With this configuration, since the electronic component group of the first component mounting section and the CPU of the second component mounting section are arranged along the wiring direction of the detection signal lines of the flexible section for the detecting element, it is possible to efficiently arrange the electronic components forming the control system while suppressing increase in complexity of the wiring layout.

EMBODIMENTS FOR CARRYING OUT THE INVENTION

An embodiment in which the present invention is applied to, for instance, a control device of an electric power steering device of a vehicle will be explained in detail below with reference to the drawings.

Figure 1:
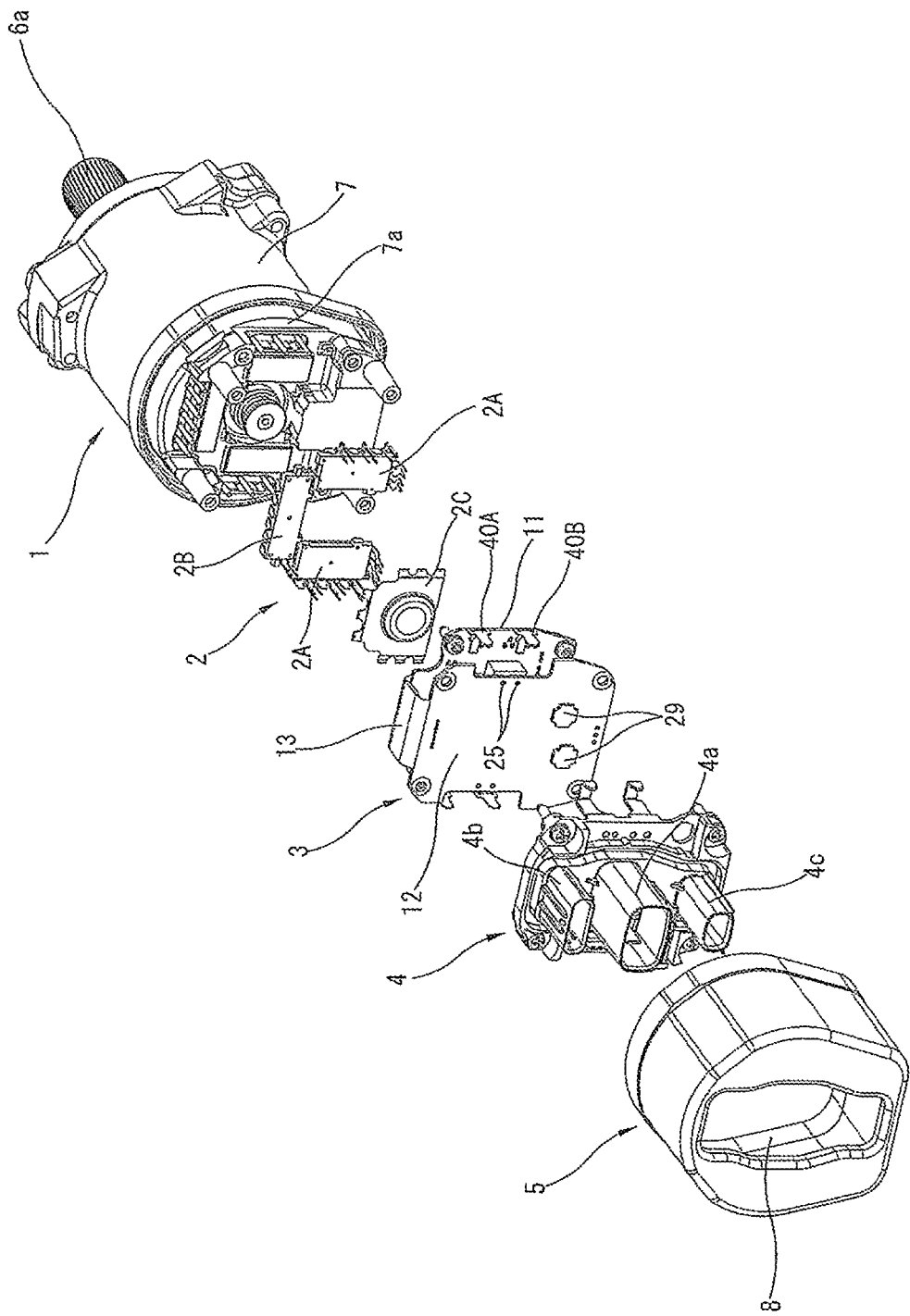
FIG. 1 is a perspective exploded view of an electric actuator device, which mounts therein a circuit board according to the present invention, for a power steering device.
Figure 2:
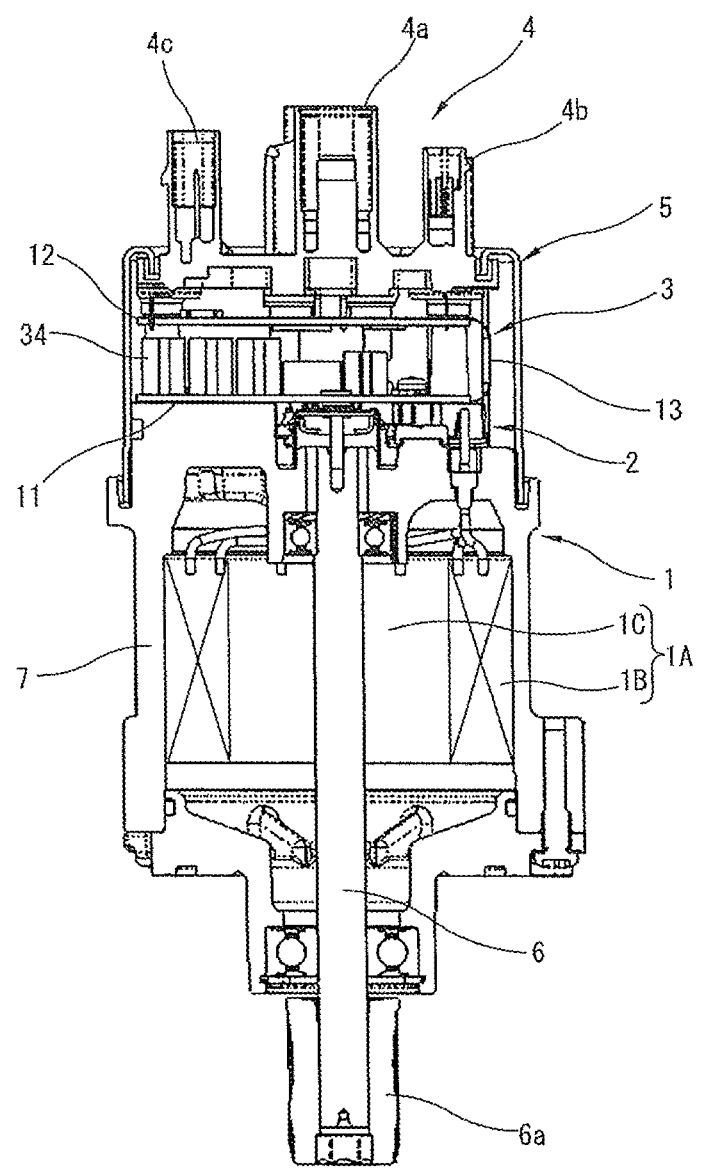
FIG. 2 is a sectional view of the electric actuator device.

FIG. 1 is a perspective exploded view of an electric actuator device that provides a steering assist force to a steering mechanism (not shown) of an electric power steering device. FIG. 2 is a sectional view of the electric actuator device. This electric actuator device has a cylindrical motor unit 1, an inverter/power module 2, a circuit board 3 formed by a foldable multilayer wiring board which is the embodiment of the present invention, a connector member 4 where a plurality of connectors are integrated and a motor cover 5 fixed to one end portion of the motor unit 1 so as to cover or accommodate the inverter/power module 2, the circuit board 3 and the connector member 4.

The motor unit 1 is a unit configured such that a motor 1A (see FIG. 2), which corresponds to an electric actuator, having a stator 1B and a rotor 1C, is accommodated in a cylindrical housing 7. The motor unit 1 has a connecting portion 6a such as a gear or a spline at a top end of a rotation shaft 6 that protrudes from a top end surface of the housing 7, and is connected to the steering mechanism (not shown) through this connecting portion 6a. The motor 1A is a three-phase permanent-magnet-type brushless motor. The stator 1B has a three-phase coil, and permanent magnets are arranged on an outer circumferential surface of the rotor 1C. Here, in order to secure redundancy, the motor 1A has a dual coil and corresponding permanent magnets.

One end portion of the housing 7, which is an opposite side to the connecting portion 6a, is formed as a bottom wall portion 7a having an outline of a horseshoe shape, a part of an outer peripheral edge of which extends in a radial direction. The motor cover 5 having an outline of a horseshoe shape corresponding to the bottom wall portion 7a is fixed to the housing 7 so as to cover this bottom wall portion 7a. Then, the inverter/power module 2, the circuit board 3 and the connector member 4 are accommodated in a space formed between the bottom wall portion 7a and the motor cover 5 with these inverter/power module 2, circuit board 3 and connector member 4 stacked in an axial direction of the rotation shaft 6.

The inverter/power module 2 includes two inverter modules 2A that drive the motor 1A and a relay module 2B that is a neutral point of the coil. These three modules are arranged so as to enclose the rotation shaft 6 with a substantially U-shaped arrangement. Further, the inverter modules 2A and the relay module 2B are fixed to an end surface of the motor unit 1 with a pressing member 2A.

The connector member 4 has three connectors that extend in a same direction along the axial direction of the rotation shaft 6. More specifically, the connector member 4 has a power connector 4a located at the middle of the connector member 4, a sensor input connector 4b inputting signals from sensors (e.g. a steering angle sensor and a torque sensor) located at a steering mechanism side and a communication connector 4c to communicate with the other control devices in the vehicle (e.g. by CAN communication). These connectors 4a, 4b and 4c protrude to the outside through an opening 8 of the motor cover 5.

In the present embodiment, the inverter/power module 2, the circuit board 3, the connector member 4 and the motor cover 5 in the electric actuator device form a "control device" recited in claims. This control device and the motor unit 1 are fixedly connected together, and thus size reduction in the entire device is achieved.

Figure 3:
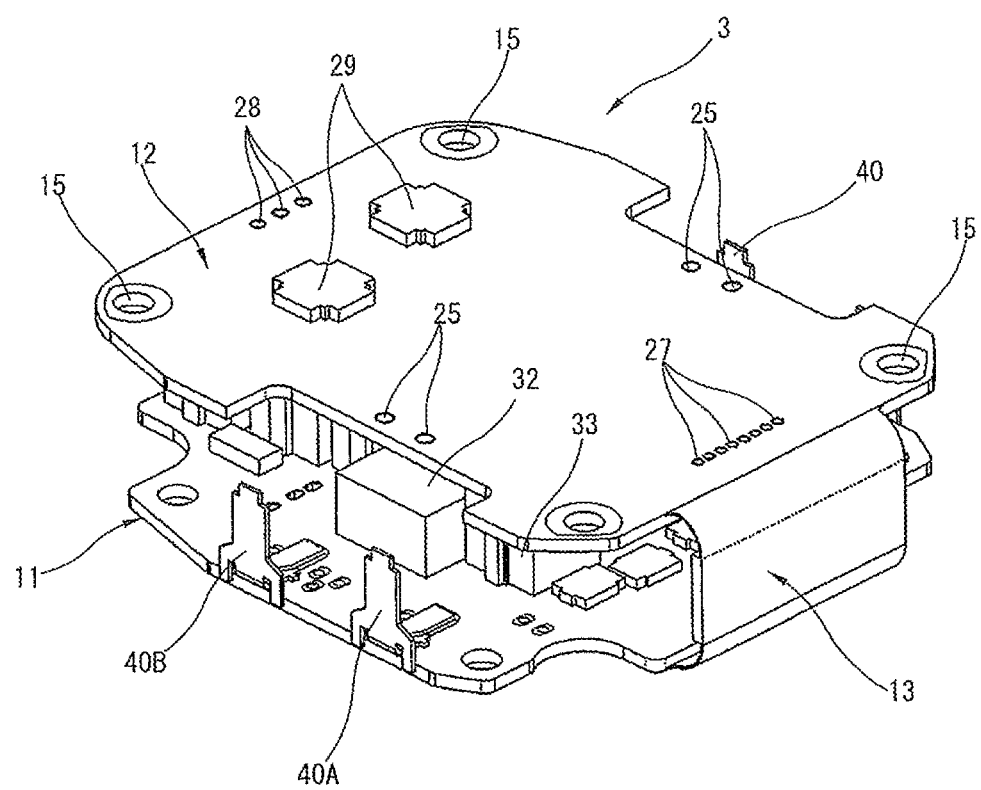
FIG. 3 is a perspective view of the circuit board in a folded state.
Figure 4:
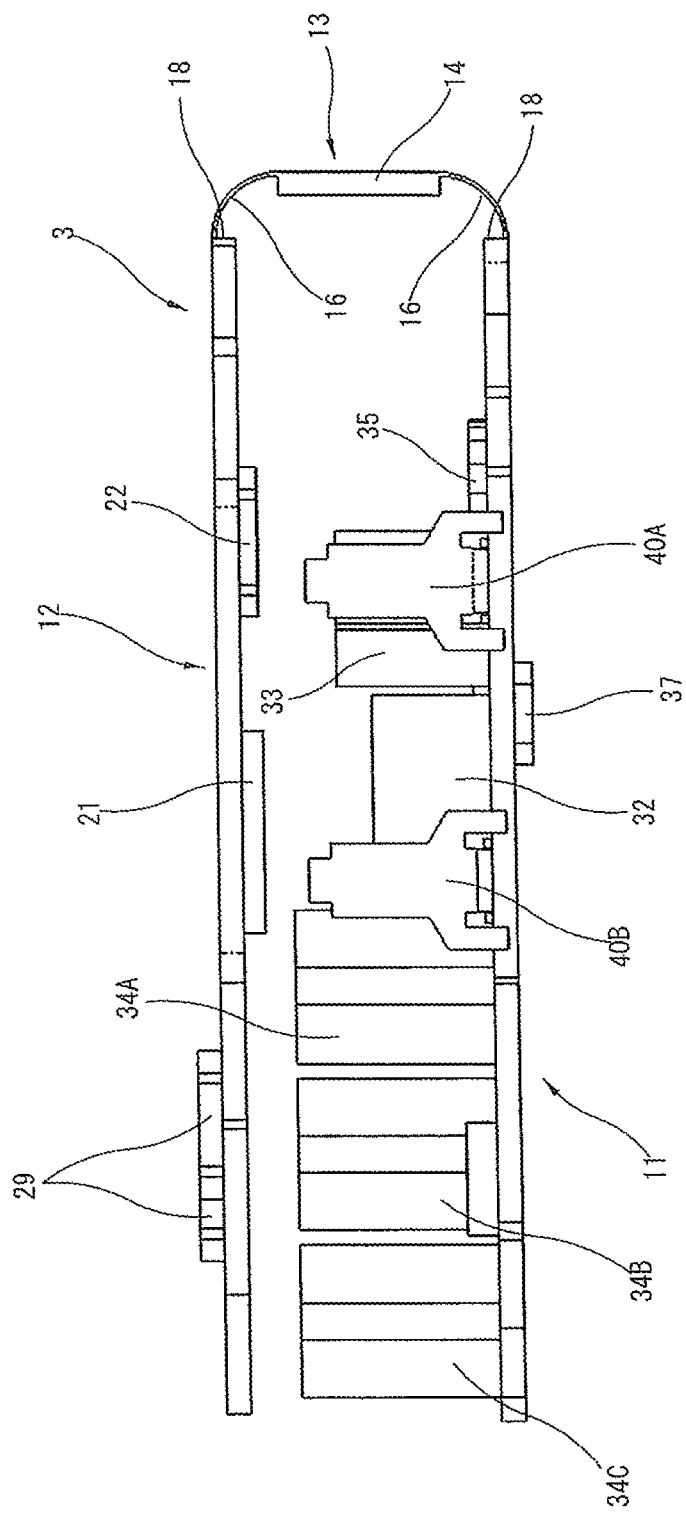
FIG. 4 is a side view of the circuit board in the folded state.

FIG. 3 is a perspective view schematically showing the circuit board 3 in a substantially U-shaped folded state. FIG. 4 is a side view. As can be seen in these FIGS. 3 and 4 and as mentioned above, the circuit board 3 is mounted in the electric actuator device with the circuit board 3 folded into the substantially U-shape.

That is, the circuit board 3 has a first rigid section 11 as a power-related board where a group of electronic components through which relatively large current passes for drive of the motor 1A through the inverter/power module 2 is mounted, a second rigid section 12 as a control-related board where control-related electronic components through which relatively small current passes are mounted, and a flexible section 13 located between the first and second rigid sections 11 and 12. The first rigid section 11 corresponds to a "first component mounting section", and the second rigid section 12 corresponds to a "second component mounting section". The circuit board 3 is then accommodated between the housing 7 and the motor cover 5 which serve as a case with the flexible section 13 being bent (or deformed) such that the first and second rigid sections 11 and 12 overlapping or stacking in the axial direction of the rotation shaft 6. As a specific example, the first rigid section 11 and the second rigid section 12 in the folded state are fixed to and supported by the electric actuator device such that each flat surface state of the first rigid section 11 and the second rigid section 12 is maintained and these flat surfaces are arranged parallel to each other while securing a distance between the first rigid section 11 and the second rigid section 12 to the extent that the electronic components mounted on the first and second rigid sections 11 and 12 do not interfere with each other.

Figure 5:
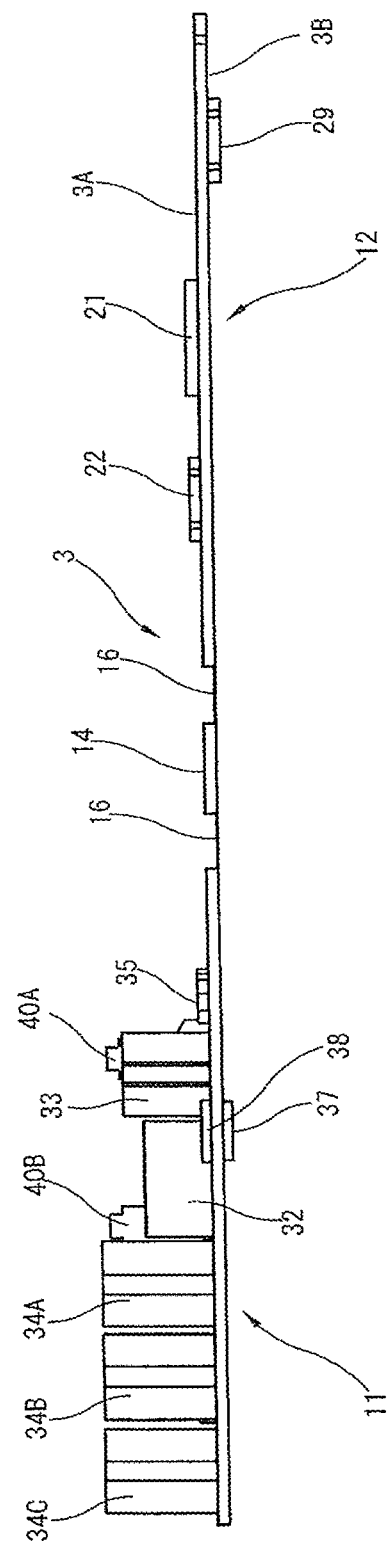
FIG. 5 is a sectional view of the circuit board in a developed state.
Figure 6:
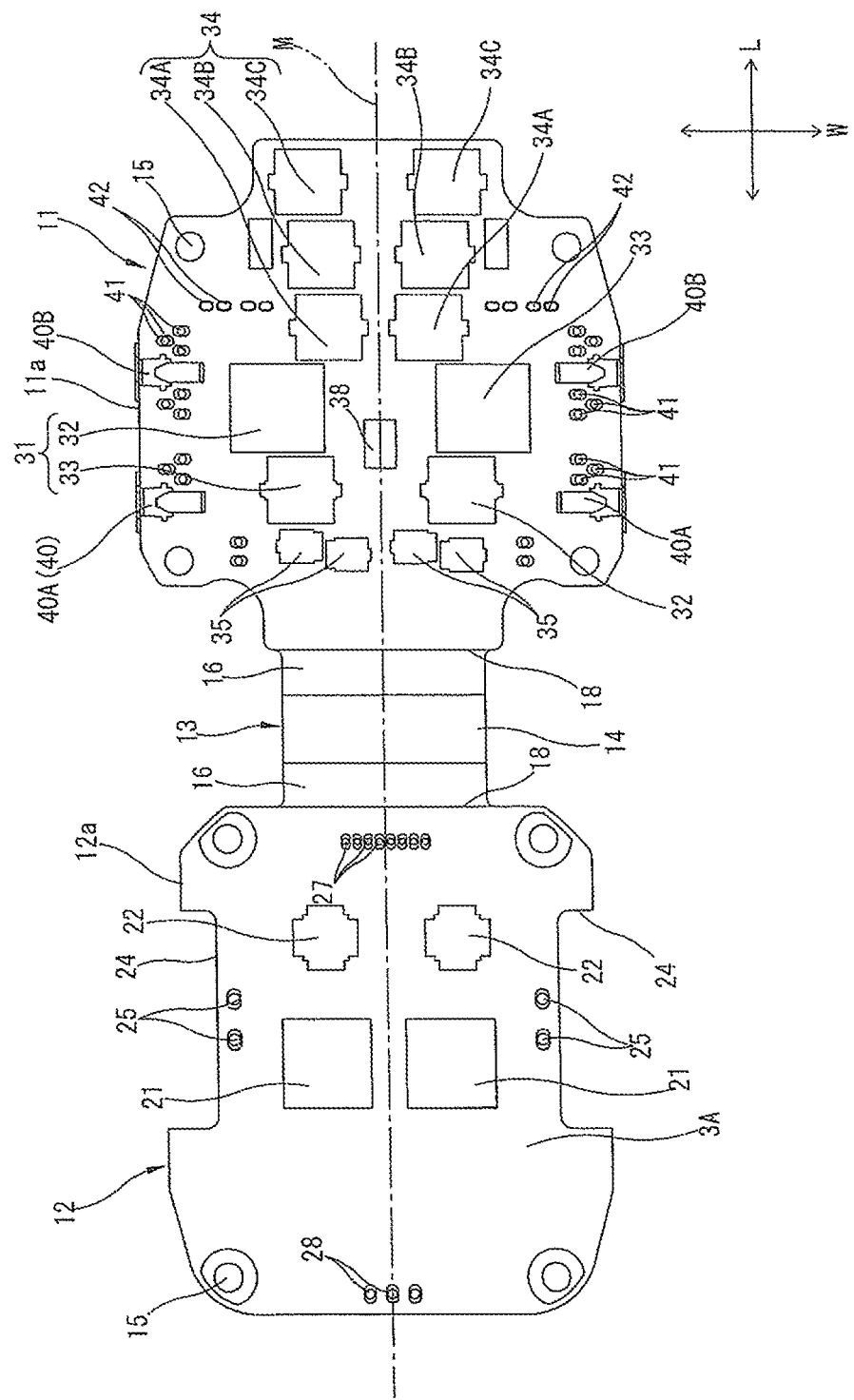
FIG. 6 is a plan view showing a first surface of the circuit board in the developed state.
Figure 7:
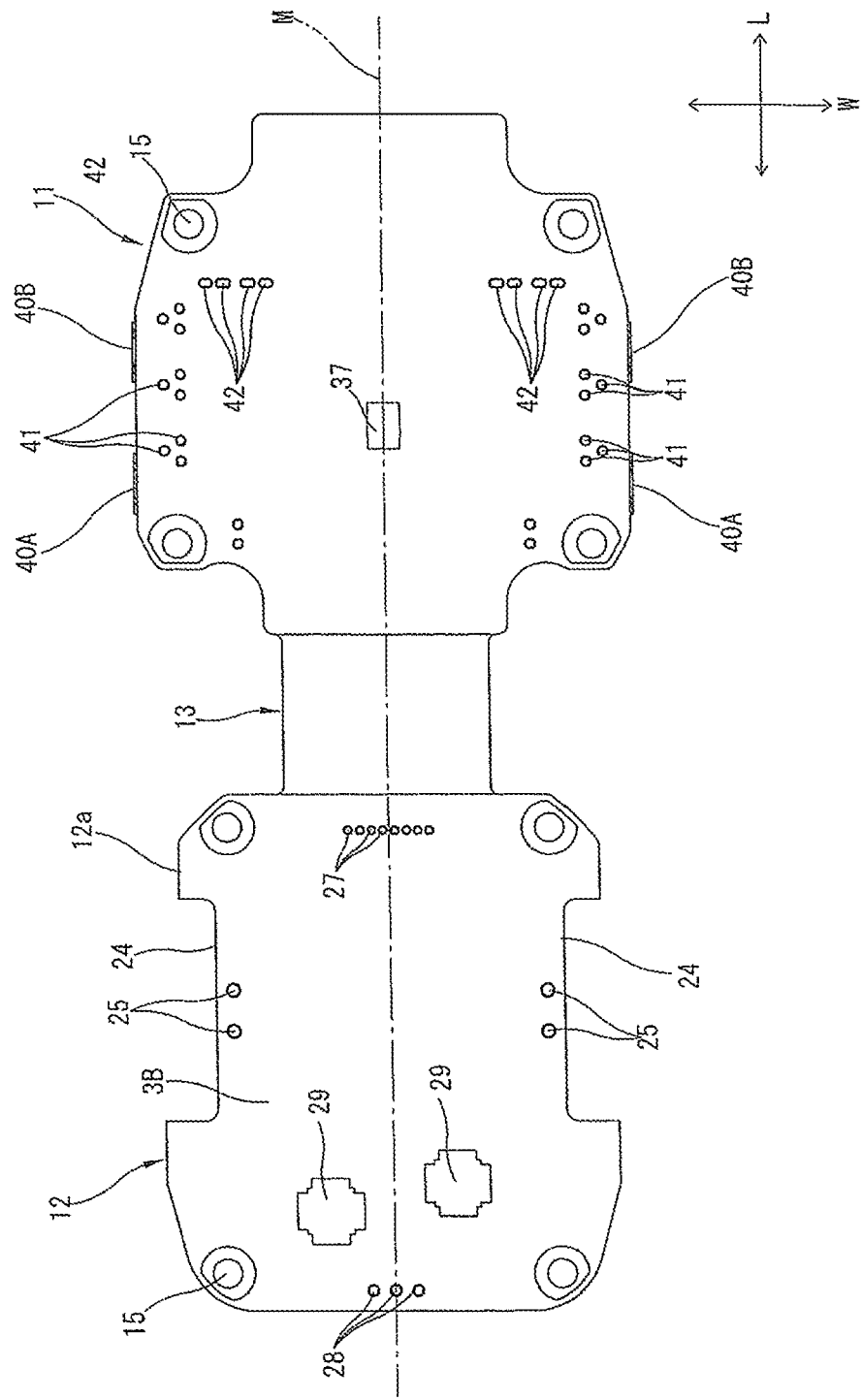
FIG. 7 is a plan view showing a second surface of the circuit board in the developed state.

FIG. 5 is a sectional view of the circuit board 3 with the circuit board 3 developed, i.e. before folding the circuit board 3 (hatchings at the board sections are omitted). The circuit board 3 formed by the one multilayer wiring board has a first surface 3A and a second surface 33. FIG. 6 is a plan view showing a configuration of the first surface 3A in the developed state of the circuit board 3. FIG. 7 is a plan view showing a configuration of the second surface 3B. The circuit board 3 is one circuit board formed by the first rigid section 11, the second rigid section 12 and the flexible section 13 being arranged on or along a plane in the developed state as shown in FIGS. 5 to 7. The circuit board 3 is finally folded into the substantially U-shape after mounting the electronic components.

Each of the first rigid section 11 and the second rigid section 12 has a shape similar to a quadrangle that has four mounting holes 15 at four corners. Further, a middle portion on one side of the first rigid section 11 and a middle portion on one side of the second rigid section 12, which are adjacent to or face each other, are coupled through the band-shaped flexible section 13 having a constant width. That is, the width of the flexible section 13 is narrow as compared with widths (sizes in a direction orthogonal to a bending direction) of the first rigid section 11 and the second rigid section 12. Therefore, the circuit board 3 as a whole is shaped like a letter "I" or "8". By forming the circuit board 3 by a relatively wide first and second rigid sections 11 and 12 and a relatively narrow flexible section 13 in this manner, a large component mounting area can be secured, also the flexible section 13 is readily bendable or deformable.

The circuit board 3 is formed by the multilayer printed wiring board, more specifically, by a so-called six-layered printed wiring board having six metal leaf layers. This multilayer printed wiring board is formed by bonding or stacking certain layered base materials made of, e.g. epoxy glass, each of which has the metal leaf layers on one surface or both surfaces, through prepregs (adhesive layers) and uniting these base materials by hot pressing. Therefore, the six metal leaf layers that become wiring layers are formed by both metal leaf layers of surface layers of the first surface 3A and the second surface 3B and four metal leaf layers of internal layers. Between the metal leaf layers, the base materials as insulating layers to insulate these metal leaf layers are interposed. Then, by performing etching of the six metal leaf layers and forming vias that extend in a stacking direction, desired circuit patterns are formed on the first rigid section 11 and the second rigid section 12.

The flexible section 13 is formed relatively thin as compared with board thicknesses (sizes in the stacking direction) of the six-layered first and second rigid sections 11 and 12 as can be seen in FIG. 4, then has flexibility that is higher than those of the first and second rigid sections 11 and 12. As an example, after forming the six-layered flexible section 13 into a rectangle that covers the first rigid section 11, the second rigid section 12 and the flexible section 13, the base materials and the metal leaf layers for four layers at the flexible section 13, which are positioned at inner sides when being folded, are removed (whittled or pared) by secondary machining, then these portions are thinned. Therefore, the base materials of the first and second rigid sections 11 and 12 and the base materials of the flexible section 13 are the same base materials, and two metal leaf layers remaining as the flexible section 13 extend or continue across the three of the first and second rigid sections 11 and 12 and the flexible section 13.

In the example shown in the drawings, to secure a print surface (a typeface) for a bar code etc., a six-layered section remains as a middle rigid section 14 at the middle of the flexible section 13. Then, the thinned portions exist as a pair of hollow grooves 16 at both sides of this middle rigid section 14. The middle rigid section 14 is not necessarily needed, and all of the flexible section 13 could be thinned.

In the present embodiment, a whole section located between the first rigid section 11 and the second rigid section 12, including the middle rigid section 14 is called the flexible section 13.

As can be seen in FIGS. 5 and 6, each hollow groove 16 is recessed, like a groove or a hollow, on the first surface 3A of the circuit board 3. On the second surface 3B, the flexible section 13 has a surface that extends or continues to the first and second rigid sections 11 and 12.

The pair of hollow grooves 16, which give a required flexibility to the flexible section 13, are formed along the respective one sides of the first rigid section 11 and the second rigid section 12. With this, boundaries 18 between the first and second rigid sections 11 and 12 and the flexible section 13 are defined. In other words, the pair of boundaries 18 are defined by respective outer edges of the thinned hollow grooves 16, and when folding the first and second rigid sections 11 and 12 at the flexible section 13 as shown in FIG. 4, the thinned flexible section 13 are bent (deformed) between these pair of boundaries 18. A width (a size in a direction orthogonal to the bending direction) of the circuit board 3 decreases at the boundaries 18 where the sections are changed from the first and second rigid sections 11 and 12 to the flexible section 13. The flexible section 13 has the band-shape having the constant width so as to be readily bent (deformed). Here, in order to suppress stress concentration due to decrease in width at the boundaries 18, corner portions at both ends of the boundaries 18 where the first and second rigid sections 11 and 12 and the flexible section 13 are coupled are rounded into an arc shape having a proper radius (see FIGS. 5 and 6).

At the flexible section 13 (at portions of the hollow grooves 16), two of the six metal leaf layers, i.e. the metal leaf layer as the surface layer at the second surface 3B side that is an outer surface when being folded and a metal leaf layer as the internal layer (i.e. a second metal leaf layer when viewed from the second surface 3B side) which is adjacent to the metal leaf layer of the outer surface, remain and exist. Here although the middle rigid section 14 has the six metal leaf layers, third to sixth metal leaf lavers when viewed from the second surface 3B side are not used as the wiring pattern.

Figure 8:
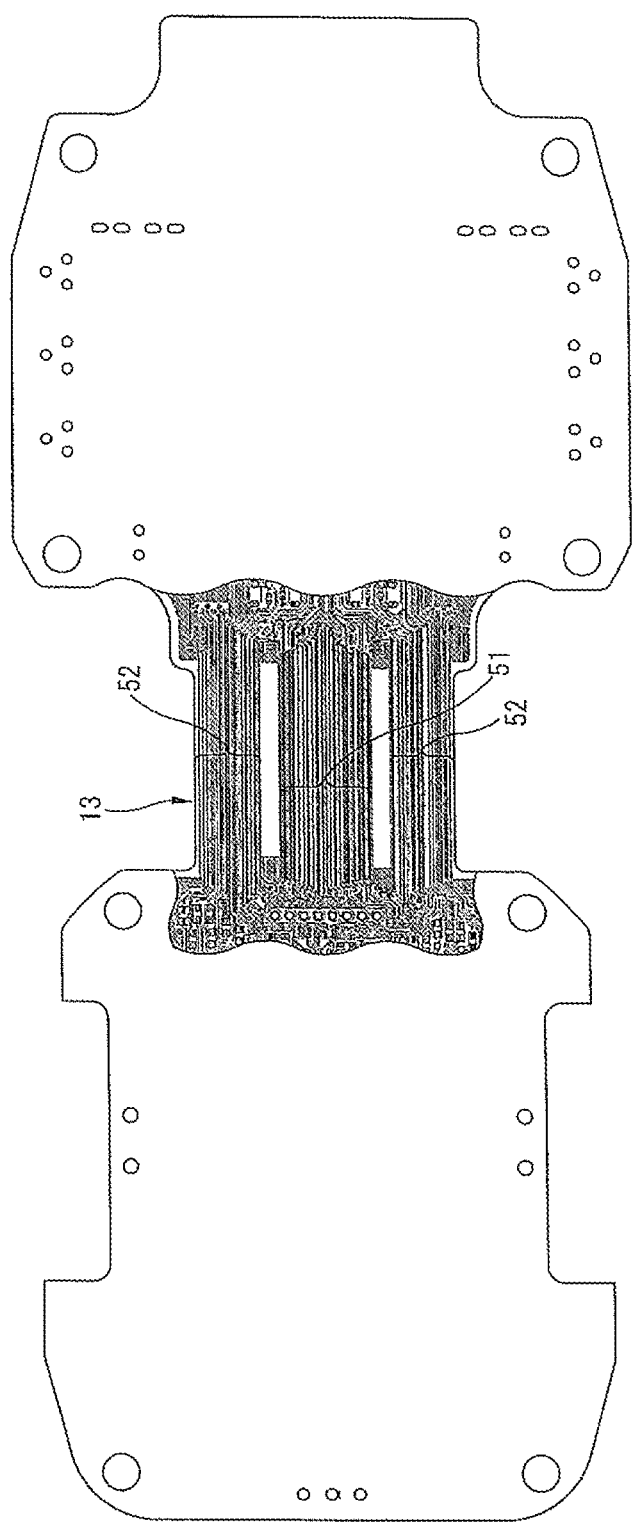
FIG. 8 is a plan view showing wiring patterns at a surface layer on a second surface side of a flexible section.
Figure 9:
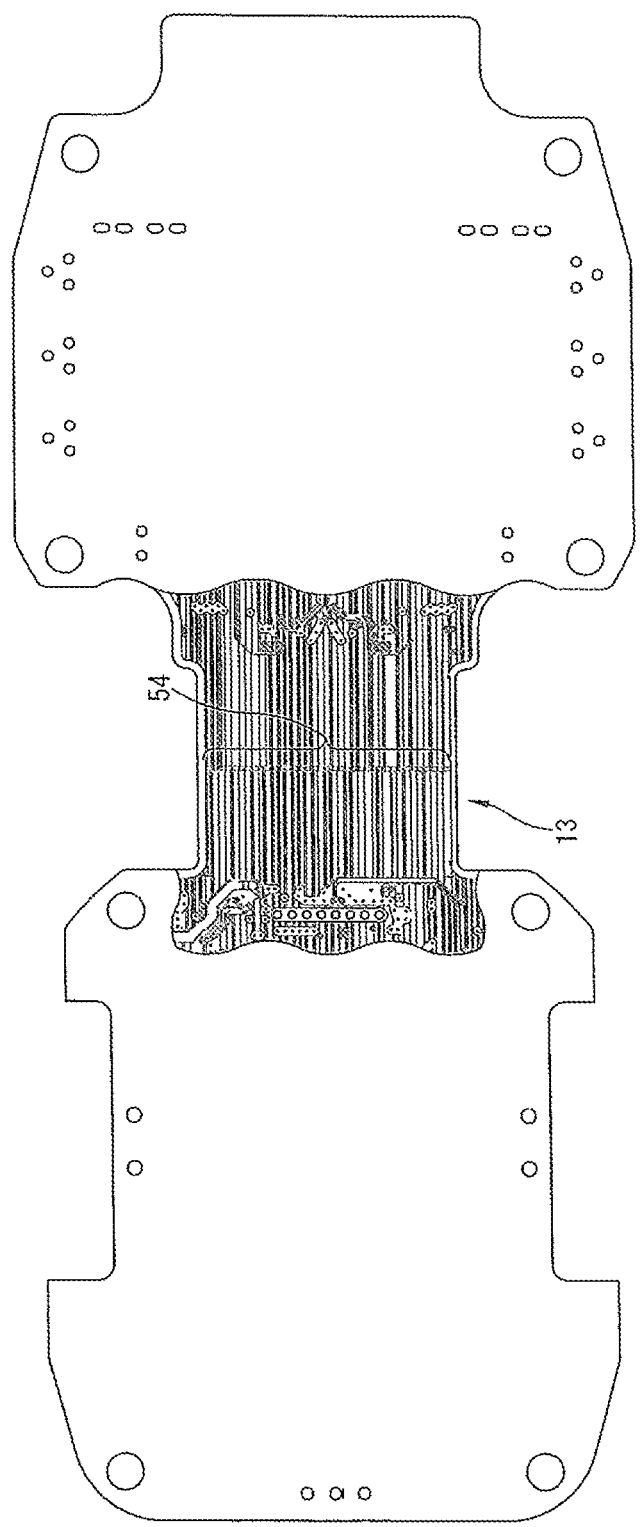
FIG. 9 is a plan view showing wiring patterns at an internal layer on the second surface side of the flexible section.

FIG. 8 shows wiring patterns formed by an etching process of the first metal leaf layer that is the surface layer of the second surface 3B side. FIG. 9 shows wiring patterns formed by an etching process of the second metal leaf layer. Each drawing depicts only the wiring patterns at the flexible section 13 that is a principal part. As the wiring patterns on the flexible section 13, only these two metal leaf layers are used. At the first rigid section 11 and the second rigid section 12, the other four metal leaf layers are further used as the wiring patterns.

Next, layouts of various kinds of components, which are a principal part of the present invention, will be explained. In the following, to facilitate the understanding, as shown in FIGS. 6 and 7, a longitudinal direction of the circuit board 3 in the developed state is called an L-direction, and a width direction orthogonal to this L-direction is called a W-direction. The above-mentioned pair of boundaries 18 of the flexible section 13 are straight lines extending in the W-direction. If a straight line along the L-direction is drawn on the circuit board 3 in the developed state, in the substantially U-shaped folded state of the circuit board 3, a plane (a plane orthogonal to the boundaries 18) is defined by the straight line on the first rigid section 11 and the straight line on the second rigid section 12. Further, for convenience of explanation, as shown in FIGS. 6 and 7, a line that crosses a rotation axis of the motor 1A when being assembled and extends parallel to the L-direction is called a board center line M.

The circuit board 3 in this embodiment has two mutually-independent control systems corresponding to the dual coil of the motor 1A. Basically, each individual control system is configured such that its components are arranged on the circuit board 3 along the L-direction that is the longitudinal direction of the circuit board 3. Also, basically, the two control systems are arranged together with or parallel to each other in the W-direction that is the width direction of the circuit board 3. Except for differences in details, the two control systems are arranged so as to be symmetrical about the board center line M.

As shown in FIG. 6, on the first surface 3A of the first rigid section 11, two filter units 31 for noise cancellation are arranged at the substantially middle in the L-direction of the first rigid section 11. Further, two capacitor units 34 are arranged at positions opposite to the flexible section 13 with respect to the filter units 31. That is, the one control system includes the one filter unit 31 and the one capacitor unit 34. The filter unit 31 is configured by a coil 32 having a rectangular case and a capacitor 33 positioned at the flexible section 13 side with respect to this coil 32 and having a rectangular case as well. The capacitor unit 34 is configured by, for instance, three capacitors 34A, 34B and 34C each having a rectangular case. A group of electronic components (an electronic component group) forming the one control system, i.e. the capacitor 33, the coil 32 and the capacitors 34A, 34B and 340, are not aligned on a straight line, but are almost lined in this order in the L-direction. Then, the capacitor 33, the coil 32 and the capacitors 34A, 34B and 340 which form the one control system and the capacitor 33, the coil 32 and the capacitors 34A, 34B and 34C which form the other control system are arranged so as to be symmetrical about the board center line M respectively.

Further, four power shutdown switching elements 35, i.e. two power shutdown switching elements 35 for each control system, are mounted between the capacitor 33 of the filter unit 31 and the flexible section 13. The two power shutdown switching elements 35 for each control system are arranged so as to be adjacent to the capacitor 33. These four power shutdown switching elements 35 are arranged almost on a straight line along the W-direction.

On the first surface 3A of the first rigid section 11, a second rotation sensor 38 as a detecting element that detects an operating state of the motor 1A is mounted between the electronic component groups of the two control systems, more specifically, between the two filter units 31. This second rotation sensor 38 is an analog rotation sensor that detects a rotation of the rotation shaft 6 of the motor 1A in combination with magnetic poles provided at an end portion of the rotation shaft 6 of the motor 1A. The second rotation sensor 38 is located at a position that is on an axial line of the rotation shaft 6 when being assembled. The second rotation sensor 38 is used for the two control systems. The second rotation sensor 38 is branched into two signal circuits on the first rigid section 11, then used in each control system.

A pair of side edge portions 11*a* that a repositioned at opposite sides to each other in the W-direction of the first rigid section 11 are each provided with a first power terminal 40. Each first power terminal 40 includes a positive electrode terminal 40A and a negative electrode terminal 40B. A set of first power terminal 40 formed by these positive electrode terminal 40A and negative electrode terminal 40B is used for the one control system. Each of the first power terminals 40 is located at an outer side in the W-direction of the circuit board 3 with respect to the corresponding electronic component group (i.e. the capacitor 33, the coil 32 and the capacitors 34A, 34B and 34C) forming the one control system.

The positive electrode terminal 40A and the negative electrode terminal 40B are each formed by a substantially L-shaped metal strip, and each stand along respective side edges of the first rigid section 11 from the first surface 3A in a direction orthogonal to the first surface 3A. The positive electrode terminal 40A and the negative electrode terminal 40B are arranged along the L-direction, and the positive electrode terminal 40A is positioned at the flexible section 13 side with respect to the negative electrode terminal 40B. More specifically, the positive electrode terminal 40A is located at a side position of the capacitor 33 of the filter unit 31, whereas the negative electrode terminal 40B is located at a side position of the coil 32 of the filter unit 31. In a finally assembled state as the electric actuator device, the first power terminals 40 are connected to respective terminal strips of the above-mentioned power connector 4a of the connector member 4. Here, the two sets of first power terminal 40 are arranged so as to be symmetrical about the board center line M.

The first rigid section 11 is further provided with gate signal ports 41 connected to respective switching elements of each aim of the inverter/power module 2 and inverter power ports 42 for providing power supply voltage to the inverter/power module 2. These ports are formed as through hole-shaped terminals. The gate signal ports 41 are arranged at positions close to the respective first power terminals 40. The inverter power ports 42 are arranged at side positions (outer sides in the W-direction) of the respective capacitor units 34. In the finally assembled state as the electric actuator device, pin-shaped terminal strips of the inverter/power module 2 are inserted into and electrically connected to these ports 41 and 42.

On the first surface 3A of second rigid section 12, two CPUs 21 for the corresponding two control systems are mounted at the substantially middle in the L-direction of the second rigid section 12. The CPU 21 is configured by an integrated circuit having a substantially square flat package. The two CPUs 21 are arranged so as to be symmetrical about the board center line M. Further, pre-driver circuit elements 22 are mounted at the flexible section 13 side with respect to the two CPUs 21. The pre-driver circuit element 22 is configured by an integrated circuit having a substantially square flat package that is smaller than the CPU 21. The two pre-driver circuit elements 22 correspond to the two control systems, and are arranged so as to be symmetrical about the board center line M. The pre-driver circuit elements 22 are aligned with the respective CPUs 21 of the control systems along the L-direction.

A pair of side edge portions 12a that are positioned at opposite sides to each other in the W-direction of the second rigid section 12 are each provided with a cutting portion 24 in order to avoid interference with the first power terminals 40 of the first rigid section 11 in the folded state. The cutting portions 24 are located almost at side positions of the respective CPUs 21 and pre-driver circuit elements 22. Further, second power terminals 25 formed by two positive and negative through holes are provided at positions along each cutting portion 24. These two sets of second power terminals 25 correspond to the two control systems. In the finally assembled state as the electric actuator device, pin-shaped terminal strips of the above-mentioned power connector 4a of the connector member 4 are inserted into and electrically connected to the through hole-shaped second power terminals 25.

An external sensor input portion 27 formed by a plurality of through hole-shaped terminals is provided at an end region of the second rigid section 12 at the flexible section 13 side. The plurality of through hole-shaped terminals are arranged on a straight line along the W-direction. In the finally assembled state as the electric actuator device, pin-shaped terminal strips of the sensor input connector 4b of the connector member 4 are inserted into the external sensor input portion 27, and signals of external sensors such as the steering angle sensor and the torque sensor are inputted to each control system through the external sensor input portion 27.

Further, at an end region of the second rigid section 12 which is an opposite side to the flexible section 13, communication ports 28 formed by a plurality of through hole-shaped terminals are provided. The plurality of through hole-shaped terminals are arranged on a straight line along the W-direction. In the finally assembled state as the electric actuator device, pin-shaped terminal strips of the communication connector 4c of the connector member 4 are inserted into the communication ports 28, and communication with the other external control devices is carried out.

As shown in FIG. 7, on the second surface 3B of the first rigid section 11, a first rotation sensor 37 as a detecting element that detects the operating state of the motor 1A is mounted at the middle of the first rigid section 11. This first rotation sensor 37 is a digital rotation sensor that detects the rotation of the rotation shaft 6 of the motor 1A in combination with the magnetic poles provided at the end portion of the rotation shaft 6 of the motor 1A. The first rotation sensor 37 is located at a position that is on the axial line of the rotation shaft 6 when being assembled. In the same manner as the second rotation sensor 38, the first rotation sensor 37 is also used for the two control systems. The first rotation sensor 37 is branched into two signal circuits on the first rigid section 11, then used in each control system.

The first rotation sensor 37 mounted on the second surface 3B and the second rotation sensor 38 mounted on the first surface 3A are located at a position where these sensors 37 and 38 overlap when projecting the circuit board 3 onto a plane. In the finally assembled state as the electric actuator device, the first rotation sensor 37 exists on the outer surface of the substantially U-shaped circuit board 3, and faces an end surface of the rotation shaft 6 of the motor 1A. The second rotation sensor 38 exists at the inner side of the substantially U-shaped circuit board 3. As an example, the first rotation sensor 37 is a main rotation sensor, and the second rotation sensor 38 is an auxiliary rotation sensor that is used, for instance, under an abnormal condition of the first rotation sensor 37.

It is noted that each rotation sensor could be used individually such that one of the rotation sensors provided on the first surface 3A and the second surface 3B is used for the one control system and the other of the rotation sensors is used for the other control system.

On the second surface 3B of the second rigid section 12, two power/communication ICs 29 each configured by an integrated circuit including a power circuit for the second rigid section 12 and a communication circuit for the communication port 28 are mounted. The power/communication IC 29 has a substantially square flat package that is smaller than the CPU 21. The two power/communication ICs 29 correspond to the two control systems, and are arranged so as to be substantially symmetrical about the board center line M. When viewed in terms of the L-direction, the power/communication ICs 29 are located at an end region of the second rigid section 12 which is an opposite side to the flexible section 13, and positioned between the second power terminals 25 and the communication ports 28. Further, when projecting the second rigid section 12 onto a plane, the power/communication ICs 29 are located between the CPUs 21 and the communication ports 28, and the CPUs 21 are located at the flexible section 13 side with respect to the power/communication ICs 29. Therefore, the CPUs 21 are located at a middle portion between the power/communication ICs 29 and the external sensor input portion 27.

The power/communication IC 29 corresponds to a "communication processing circuit unit" that carries out communication with the other external control devices through the communication ports 28. The power/communication IC 29 also corresponds to a "second component mounting section power circuit unit" that converts a terminal voltage inputted to the second power terminals 25 into an operating voltage for the second rigid section 12. Here, in the present invention, the power circuit and the communication circuit could be configured as individual integrated circuits.

Although the layouts of the main components are explained above, besides the above electronic components, a large number of relatively small-sized electronic components (not shown) are mounted on the surfaces of the first rigid section 11 and the second rigid section 12.

Detection signals of the first rotation sensor 37 and the second rotation sensor 38 provided on the first rigid section 11 are sent to the second rigid section 12 side where the CPUs 21 are mounted through detection signal lines provided at the flexible section 13. As explained above, FIG. 8 depicts the wiring patterns formed by the etching process of the first metal leaf layer that is the surface layer of the second surface 3B side. A plurality of detection signal lines 51 for the first and second rotation sensors 37 and 38 are arranged at the middle in the W-direction of the metal leaf layer of the surface layer on the second surface 3B side. These detection signal lines 51 linearly extend in the L-direction at the flexible section 13. The plurality of detection signal lines 51 are arranged parallel to each other. The detection signal of the second rotation sensor 38 located at the first surface 3A side is branched into two systems at the first surface 3A side, and sent to the second surface 3B side through through holes (vias), then connected (sent) to the detection signal lines 51.

In addition to the detection signal lines 51, a plurality of control signal lines 52 that are connecting lines between the first rigid section 11 and the second rigid section 12 are formed together with or parallel to the detection signal lines 51 at the first metal leaf layer as the surface layer on the second surface 3B side of the flexible section 13. These control signal lines 52 are located at outer sides (both sides) of the detection signal lines 51 in the W-direction. The control signal lines 52 also linearly extend in the L-direction at the flexible section 13. The plurality of control signal lines 52 are arranged parallel to each other. The plurality of control signal lines 52 located at one side in the W-direction with the detection signal lines 51 being a center are the control signal lines 52 for the one control system, and the plurality of control signal lines 52 located at the other side in the W-direction are the control signal lines 52 for the other control system.

As shown in FIG. 9, ground lines 54 are formed at the second metal leaf layer as the internal layer at the flexible section 13. Each ground line 54 is formed into a band-shape that is wider than the detection signal line 51 and the control signal line 52. As a preferable example, a ground line having a wide band-shape (an enlarged band-shape) that extends almost throughout the width (the size in the W-direction) of the flexible section 13 is formed. The ground lines 54 are electrically connected to a certain portion such as the housing 7 that is at the ground potential through a certain path or route (not shown in detail).

Figure 10:
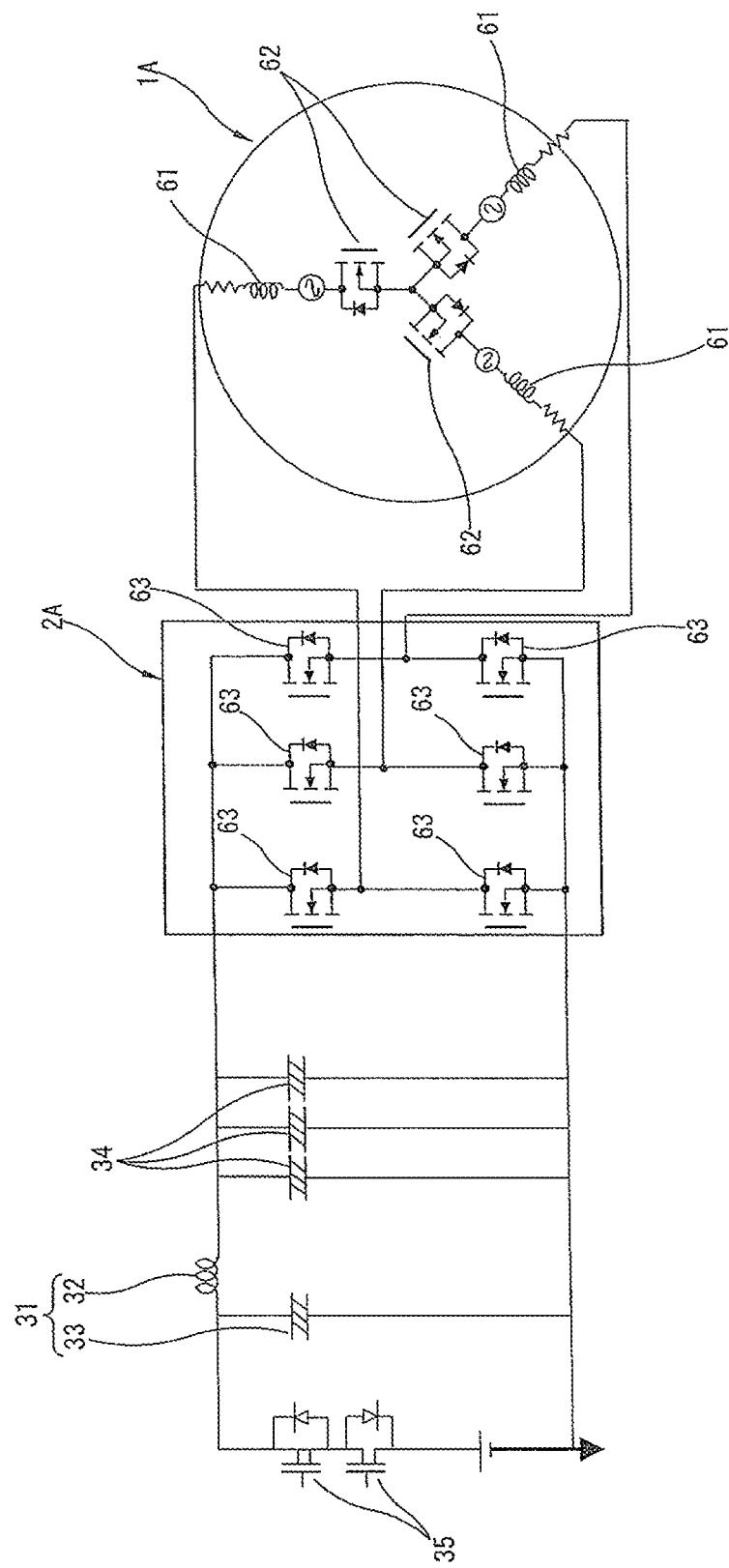
FIG. 10 is a circuit diagram showing a configuration of an inverter circuit.

FIG. 10 shows a circuit configuration of an inverter circuit that drives the motor 1A. As shown in the drawing, the stator 113 of the motor 1A has coils 61 for three phases of U, V and W, and neutral point relays 62 are provided for each coil. The neutral point relays 62 are configured by the above-mentioned relay module 213. The inverter module 2A includes six switching elements 63 each forming upper and lower arms for the three phases of U, V and W, then the inverter circuit is configured by this configuration. As shown in the drawing, a DC power unit of the inverter circuit includes the capacitor unit 34 and the filter unit 31 (the coil 32 and the capacitor 33). Further, the two power shutdown switching elements 35 are arranged in series at a positive electrode side. Here, FIG. 10 depicts only the one system. As described above, in the present embodiment, the coils 61 and the inverter circuits for the two systems are provided. In the present embodiment, the coils 61 for the two systems correspond to "drive units" recited in claims, and the inverter circuits for the two systems correspond to a "drive circuit" recited in claims.

As explained above, as the one embodiment, the control systems for the two systems corresponding to the respective coils (the dual coil) of the motor 1A for the two systems are mutually independently formed on the circuit board 3, and these two control systems are substantially arranged so as to be symmetrical about the board center line M that crosses the first and second rotation sensors 37 and 38. When explaining one of the control systems, the detection signals of the first and second rotation sensors 37 and 38 in response to the rotation of the motor 1A are sent from the first rigid section 11 to the second rigid section 12 through the detection signal lines 51 of the flexible section 13. The CPU 21 of the second rigid section 12 executes arithmetic processing using these detection signals as a parameter, and generates a command signal for the motor 1A. This command signal is amplified by the pre-driver circuit element 22, and converted into an operating signal for the inverter circuit. This operating signal is sent from the second rigid section 12 to the first rigid section 11 through the control signal lines 52 of the flexible section 13, then finally outputted as a gate signal to the inverter/power module 2 through the gate signal ports 41 of the first rigid section 11. The inverter/power module 2 is supplied with the power supply voltage from the first power terminal 40 of the first rigid section 11 through the power shutdown switching elements 35, the filter unit 31, the capacitor unit 34 and the inverter power ports 42, and drives the motor 1A with an inverter operation based on the gate signal.

Here, the electronic component group (the capacitor 33, the coil 32 and the capacitors 34A, 34B and 34C) and the CPU 21 of the second rigid section 12, which form the one control system, are arranged along a wiring direction (i.e. the L-direction) of the detection signal line 51 of the flexible section 13. Therefore, interference between the electronic components and increase in complexity of the wiring pattern between the components (for instance, occurrence of a large number of bypass circuits) in terms of the layout can be suppressed. It is therefore possible to efficiently arrange each control system on the circuit board 3 that has a limited area and has a separated shape by the flexible section 13. Especially in the present embodiment, since the two control systems are arranged so as to be symmetrical about the board center line M, and in combination with the arrangement of each control system along the wiring direction of the detection signal line 51, it is possible to efficiently arrange the two control systems. Further, each of the control systems is configured so as to be long narrow (so as to be a strip shape) along the wiring direction (i.e. the L-direction) of the detection signal line 51. Hence, there is a tendency for wiring paths (or wiring routes) as a whole in each control system to be linear along the L-direction, which reduces an increase in wiring length caused by complexity of the wiring paths. Further, these bring an advantage in noise resistance.

Moreover, the first and second rotation sensors 37 and 38 are arranged so as to be sandwiched between rows (or lines) of the electronic component groups (the capacitors 33, the coils 32 and the capacitors 34A, 34B and 34C) of the two control systems at the first rigid section 11, and detection signal lines are formed so as to extend along the board center line M from the first and second rotation sensors 37 and 38 to the flexible section 13 side, thereby reducing intersection or crossing of the signal lines.

On the flexible section 13, the detection signal lines 51 and the control signal lines 52 are arranged together with or parallel to each other at the metal leaf layer as the surface layer and extend parallel to each other. It is therefore possible to arrange a large number of wirings at the flexible section 13 having a limited width with the arrangement being simplified. That is, densified wiring arrangement can be achieved. Further, it is possible to provide the relatively wide ground line 54 at the second metal leaf layer as the internal layer. With these configurations or structures, a plate thickness (a plate thickness at the hollow groove 16) of the flexible section 13 can be thinner, and sufficient flexibility can be obtained.

Since the wide ground line 54 exists at the flexible section 13, a folding strength (or a bending strength) at the flexible section 13 can be increased. Preferably, a width of the ground line 54 is set to be larger than a total width of the plurality of signal lines of the surface layer including the detection signal lines 51 and the control signal lines 52. With this, the ground line 54 acts as a kind of reinforcing material, then a sufficiently high folding strength can be obtained.

The rotation sensors 38 and 37 are mounted on the first surface 3A and the second surface 3B of the first rigid section 11, and the detection signal of the second rotation sensor 38 is sent to the second surface 3B side, then this detection signal is sent to the detection signal lines 51 of the flexible section 13 together with the detection signal of the first rotation sensor 37. Therefore, all the detection signal lines 51 can be formed by one metal leaf layer at the flexible section 13. Densified wiring arrangement can thus be achieved at the flexible section 13, and also an arrangement of the terminals of the input portion can be concentrated at the second rigid section 12.

Further, the detection signal of each of the first and second rotation sensors 37 and 38 used for the two control systems is branched into two systems at the first rigid section 11, then sent to the detection signal lines 51 of the flexible section 13, thereby improving resistance to a break of the detection signal line 51 at the flexible section 13.

On the flexible section 13, the detection signal lines 51 are located at the middle in the W-direction of the flexible section 13, and the control signal lines 52 for each control system are located at the both sides of the detection signal lines 51. In general, when thinning the flexible section 13, a crack tends to appear with a side edge of the thinned flexible section 13 being a starting point of the crack. For instance, the crack tends to appear along the boundary 18 between the first and second rigid sections 11 and 12. In a case where such crack appears, the detection signal lines 51 located at the middle in the W-direction of the flexible section 13 are relatively resistant to the break. Even if either one side of the control signal lines 52 located at the both sides in the W-direction breaks, it is possible to continue to perform a drive control of the motor 1A by the other side control system.

At the second rigid section 12, as the arrangement along the L-direction, the external sensor input portion 27 is provided at one side of the CPU 21, and the communication port 28 and the power/communication IC 29 are provided at the other side of the CPU 21. Further, the external sensor input portion 27 is located at the flexible section 13 side where the detection signal lines 51 from the rotation sensors 37 and 38 are formed. Therefore, the detection signals of the rotation sensors 37 and 38 and detection signals from the external sensors can be collectively inputted to the CPU 21, thereby suppressing increase in complexity of signal wiring arrangement. Furthermore, signal lines extending from the CPU 21 to the power/communication IC 29 and the communication port 28 are arranged at an opposite side to the signal wiring. This therefore reduces a tendency for intersection or crossing with the detection signal lines 51 from the rotation sensors 37 and 38 and the external sensors to occur. Accordingly, it is possible to suppress an increase in wiring distance and an increase in size of the circuit board.

Moreover, in the present embodiment, in the substantially U-shaped folded state of the circuit board 3, the first power terminal 40 of the first rigid section 11 and the second power terminals 25 of the second rigid section 12 are adjacent to each other. With this, the power connector 4a of the connector member 4 can be small in size, and an increase in mounting area of the connector can be suppressed. At the second rigid section 12, the power supply voltage is inputted to the power/communication IC 29 through the second power terminals 25, and transformed into a predetermined operating voltage, then supplied to the various kinds of electronic components including the CPU 21 on the second rigid section 12. Here, the second power terminals 25 are located at the positions along the cutting portion 24 of the second rigid section 12, and also the power/communication IC 29 is located at the end region that is the opposite side to the flexible section 13. Therefore, input wiring from the second power terminal 25 to the power/communication IC 29 can be arranged at an outer edge side of the second rigid section 12. Also, a wiring path (or a wiring route) for an output to supply power from the power/communication IC 29 can be secured at an inner side region of the second rigid section 12.

It is noted that the power supply voltage supplied from the power connector 4a to the first power terminal 40 and the power supply voltage supplied to the second power terminals 25 could be the same voltage, or might be different voltages.

A large number of electronic components described above are mounted on the circuit board 3 by so-called reflow soldering. Here, the CPU 21, the capacitor 33, the coil 32 and the capacitors 34A, 34B and 34C, which are relatively large-sized components having a relatively large weight, are mounted on the same surface, i.e. the first surface 3A, of the circuit board 3. Therefore, by performing the reflow soldering with the circuit board 3 situated such that the first surface 3A faces upward in the gravity direction, a soldering operation can be performed with great efficiency while suppressing fall-off of these large-sized components. In other words, it is possible to eliminate or reduce temporary fixing of these large-sized components with an adhesive, and also an occurrence of failure or a defective component during the soldering operation can be reduced.

On the other hand, the power/communication IC 29 is mounted on a different surface from the surface of the CPU 21, i.e. the second surface 3B, of the second rigid section 12. This is because as compared with the capacitor 33 etc., the power/communication IC 29 is generally light in weight and a component mounting area (a component occupation area) is relatively large due to the flat package and these are taken into consideration. By arranging the power/communication IC 29 and the CPU 21, both of which have a large occupation area, on the different surfaces, mounting efficiency of the second rigid section 12 is improved. Here, when performing the reflow soldering, the power/communication IC 29 is temporarily fixed with the adhesive, then soldered.

At the first rigid section 11, the first power terminal 40 is located at the side position of the filter unit 31, and the positive electrode terminal 40A is positioned at the flexible section 13 side with respect to the negative electrode terminal 405. Therefore, a positive electrode-side power path (or a positive electrode-side power route) from the positive electrode terminal 40A toward the filter unit 31 through the power shutdown switching elements 35 is shortened. Then, since the positive electrode-side power path is arranged along the L-direction from the filter unit 31 to the inverter power ports 42 through the capacitor unit 34, this path is also shortened.

The command signal generated at the CPU 21 of the second rigid section 12 is relatively weak and likely to be affected by noises. In the present embodiment, the command signal generated at the CPU 21 is amplified by the pre-driver circuit element 22, then sent to the first rigid section 11 through the detection signal lines 51 of the flexible section 13. A wiring path length between the CPU 21 and the pre-driver circuit element 22 can be shortened as compared with the detection signal line 51 extending on the flexible section 13. That is, a length of the path where the weak signal is sent can be set to be shorter than a length of the path where the amplified signal is sent. This brings an advantage in noise resistance.

Although the embodiment of the present invention is explained in detail above, the present invention is not limited to the above embodiment. The present invention includes various modifications. For instance, in the above embodiment, the flexible section 13 has the band-shape having a constant width. However, even if the flexible section does not have such a simple shape, the present invention can be applied. Further, in the above embodiment, the flexible section 13 is formed by removing the four layers of the six-layered circuit board. However, the present invention is not limited to this configuration. Moreover, the width in the W-direction of the flexible section 13 is not necessarily smaller than the widths in the W-direction of the first and second rigid sections 11 and 12.

In addition, the present invention can be applied to various kinds of electronic control devices without being limited to the above circuit board of the electric actuator device for the power steering device.

It is noted that a certain electronic component(s) except the electronic components described above could be amounted on the middle rigid section 14 provided between the first rigid section 11 and the second rigid section 12. The present invention does not exclude such a configuration.

In a case of a configuration whose flexible section 13 having the flexibility is formed by thinning a part of one multilayer wiring board that normally has solidity, since a position relationship between the rigid sections 11 and 12 having the solidity and the flexible section 13 is fixed, and in combination with reduction in rate of a mountable area of the electronic component due to the forming of the flexible section 13, it is difficult to determine the mounting layout and the wiring layout of the electronic components. However, in the above embodiment, as explained above, it is possible to efficiently arrange the electronic components and wiring, which can solve the problem occurring when thinning a part of the one multilayer wiring board.

As described above, as one aspect of the present invention, an electronic control device for driving and controlling an electric actuator comprises: a multilayer wiring board having a plurality of wiring layers and insulating layers that insulate the wiring layers, and wherein the multilayer wiring board has first and second component mounting sections on which electronic components are mounted; a flexible section located between the first and second component mounting sections, wherein the flexible section has a structure in which the number of the wiring layers of the flexible section is smaller than those of the first and second component mounting sections and a board thickness of the flexible section is relatively thin as compared with the first and second component mounting sections, the flexible section has flexibility that is higher than those of the first and second component mounting sections by the structure of the flexible section; a detecting element mounted on the first component mounting section and configured to detect an operating state of the electric actuator; and detection signal lines formed at the wiring layer of the flexible section and configured to send signals of the detecting element from the first component mounting section to the second component mounting section, and a group of electronic components mounted on the first component mounting section and a CPU mounted on the second component mounting section, which form one control system for the electric actuator, are arranged along a wiring direction of the detection signal lines.

As a preferable electronic control device, the multilayer wiring board has a first surface and a second surface, the flexible section is recessed and has a hollow shape on the first surface, and has a surface that continues to the first and second component mounting sections on the second surface, the detecting element is placed on the second surface of the first component mounting section, the detection signal lines are formed at the wiring layer that is a surface layer on the second surface side of the flexible section, and a ground line is formed at the wiring layer that is an internal layer on the second surface side of the flexible section.

As a far preferable electronic control device, the multilayer wiring board has a first surface and a second surface, the flexible section is recessed and has a hollow shape on the first surface, and has a surface that continues to the first and second component mounting sections on the second surface, the detecting element is placed on the second surface of the first component mounting section, the detection signal lines are formed at the wiring layer that is a surface layer on the second surface side of the flexible section, and control signal lines that connect the first and second component mounting sections are formed parallel to the detection signal lines at the same wiring layer as the detection signal lines.

As another preferable electronic control device, the multilayer wiring board has a first surface and a second surface, the flexible section is recessed and has a hollow shape on the first surface, and has a surface that continues to the first and second component mounting sections on the second surface, the detecting element includes a first detecting element and a second detecting element, and the first detecting element is placed on the second surface of the first component mounting section and the second detecting element is placed on the first surface of the first component mounting section, the detection signal lines are formed at the wiring layer that is a surface layer on the second surface side of the flexible section, and the first detecting element and the second detecting element are connected to the detection signal lines at the first component mounting section.

The flexible section has, as the wiring layers, two layers of the wiring layer as a surface layer of the flexible section and the wiring layer as an internal layer of the flexible section, a plurality of signal lines including the detection signal lines are formed at the wiring layer of the surface layer, and a ground line having a width that is larger than a total width of the plurality of signal lines is formed at the wiring layer of the internal layer.

As a preferable electronic control device, the second component mounting section has the CPU configured to execute arithmetic processing using a detection signal of the detecting element as a parameter and generate a command signal for the electric actuator; an external sensor input portion configured to input signals from sensors provided outside the electronic control device; and a communication processing circuit unit configured to carry out communication with other external control devices, and on the second component mounting section, the external sensor input portion is located at a flexible section side, the communication processing circuit unit is located at an opposite side to the flexible section, and the CPU is located at a middle portion between the external sensor input portion and the communication processing circuit unit.

As a far preferable electronic control device, the first component mounting section has a first power terminal, the first power terminal is located at a side edge portion of the first component mounting section and also located at an outer side with respect to the electronic component group forming the control system, and the second component mounting section has second power terminals at a side edge portion of the second component mounting section, and a second component mounting section power circuit unit configured to convert a terminal voltage inputted to the second power terminals into an operating voltage for the second component mounting section is provided at an end region, which is an opposite side to the flexible section, of the second component mounting section.

Preferably, the second component mounting section has a cutting portion at a position of the side edge portion which faces the first power terminal with the multilayer wiring board being folded, and the second power terminals are arranged at positions along the cutting portion.

As a preferable electronic control device, the second component mounting section has second power terminals configured to supply power to the second component mounting section, and the second power terminals are located at a side edge portion of the second component mounting section, the CPU is mounted on a first surface of the second component mounting section, and a second component mounting section power circuit unit configured to convert a terminal voltage inputted to the second power terminals into an operating voltage for the second component mounting section is mounted at an end region, which is an opposite side to the flexible section, of the second component mounting section on a second surface of the second component mounting section.

As a far preferable electronic control device, the first component mounting section has a first power terminal having a positive electrode and a negative electrode, the first power terminal is located at a side edge portion of the first component mounting section and also located at an outer side with respect to the electronic component group forming the control system, the positive electrode and the negative electrode are arranged along the direction of the detection signal lines, and the positive electrode is positioned at a flexible section side with respect to the negative electrode, and power shutdown switching elements configured to be able to interrupt power supplied from the first power terminal to the electronic component group are provided between the electronic component group and the flexible section.

As another preferable electronic control device, the second component mounting section has the CPU configured to execute arithmetic processing using a detection signal of the detecting element as a parameter and generate a command signal for the electric actuator; and a pre-driver circuit element configured to convert the command signal into a control signal for a drive circuit configured to drive the electric actuator, and the CPU, the pre-driver circuit element and a filter component and a sub-capacitor which are included in the electronic component group are mounted on a same surface of the multilayer wiring board.

Further, as another aspect of the present invention, an electronic control device for driving and controlling an electric actuator having two drive units comprises: a multilayer wiring board having a plurality of wiring layers and insulating layers that insulate the wiring layers, and wherein the multilayer wiring board has first and second component mounting sections on which electronic components are mounted; a flexible section located between the first and second component mounting sections, wherein the flexible section has a structure in which the number of the wiring layers of the flexible section is smaller than those of the first and second component mounting sections and a board thickness of the flexible section is relatively thin as compared with the first and second component mounting sections, the flexible section has flexibility that is higher than those of the first and second component mounting sections by the structure of the flexible section; a detecting element mounted on the first component mounting section and configured to detect an operating state of the electric actuator; and detection signal lines formed at the wiring layer of the flexible section and configured to send signals of the detecting element from the first component mounting section to the second component mounting section, and each of two control systems that correspond to the two drive units of the electric actuator is formed by a group of electronic components mounted on the first component mounting section and a CPU mounted on the second component mounting section, and the detecting element is arranged at the first component mounting section such that the detecting element is sandwiched between rows of the two groups of the electronic components corresponding to the two control systems.

As a preferable electronic control device, the second component mounting section has, for each of the two control systems, the CPU configured to execute arithmetic processing using a detection signal of the detecting element as a parameter and generate a command signal for the electric actuator; and a pre-driver circuit element configured to convert the command signal into a control signal for a drive circuit configured to drive the electric actuator, and the CPU, the pre-driver circuit element and the electronic component group of the first component mounting section all belonging to each of the two control systems are arranged along a direction of an imaginary line that passes through a middle of the flexible section and the detecting element, and an output signal of the pre-driver circuit element is sent to a first component mounting section side through lines of the flexible section.

As a far preferable electronic control device, the detection signal lines are formed at one of the wiring layers of the flexible section, control signal lines that send control signals from the second component mounting section to the first component mounting section are formed at the same wiring layer as the detection signal lines for each control system, and the control signal lines of the two control systems are arranged at both sides of the detection signal lines.

As another preferable electronic control device, the multilayer wiring board has a first surface and a second surface, the detecting element is mounted on the second surface of the first component mounting section, and the two electronic component groups each forming the control system are mounted on the first surface of the first component mounting section, and when projecting the first component mounting section onto a plane, the detecting element is positioned such that the detecting element is sandwiched between a certain electronic component of the one control system and an electronic component, which has the same function as the certain electronic component, of the other control system, and such that the detecting element does not overlap these two electronic components.

As another preferable electronic control device, the detecting element is used for the two control systems, and a detection signal of the detecting element is branched into the two systems at the first component mounting section, and inputted to each of the control systems through the detection signal lines of the flexible section.

The invention claimed is:

1. An electronic control device for driving and controlling an electric actuator comprising:
a multilayer wiring board having a plurality of wiring layers and insulating layers that insulate the wiring layers, and wherein
the multilayer wiring board has
first and second component mounting sections on which electronic components are mounted;
a flexible section located between the first and second component mounting sections, wherein the flexible section has a structure in which the number of the wiring layers of the flexible section is smaller than those of the first and second component mounting sections and a board thickness of the flexible section is relatively thin as compared with the first and second component mounting sections, the flexible section has flexibility that is higher than those of the first and second component mounting sections by the structure of the flexible section;
a detecting element mounted on the first component mounting section and configured to detect an operating state of the electric actuator; and
detection signal lines formed at the wiring layer of the flexible section and configured to send signals of the detecting element from the first component mounting section to the second component mounting section, and
a group of electronic components mounted on the first component mounting section and a CPU mounted on the second component mounting section, which form one control system for the electric actuator, are arranged along a wiring direction of the detection signal lines.

2. The electronic control device as claimed in claim 1, wherein:
the multilayer wiring board has a first surface and a second surface,
the flexible section is recessed and has a hollow shape on the first surface, and has a surface that continues to the first and second component mounting sections on the second surface,
the detecting element is placed on the second surface of the first component mounting section,
the detection signal lines are formed at the wiring layer that is a surface layer on the second surface side of the flexible section, and
a ground line is formed at the wiring layer that is an internal layer on the second surface side of the flexible section.

3. The electronic control device as claimed in claim 1, wherein:
the multilayer wiring board has a first surface and a second surface,
the flexible section is recessed and has a hollow shape on the first surface, and has a surface that continues to the first and second component mounting sections on the second surface,
the detecting element is placed on the second surface of the first component mounting section,
the detection signal lines are formed at the wiring layer that is a surface layer on the second surface side of the flexible section, and
control signal lines that connect the first and second component mounting sections are formed parallel to the detection signal lines at the same wiring layer as the detection signal lines.

4. The electronic control device as claimed in claim 1, wherein:
the multilayer wiring board has a first surface and a second surface,
the flexible section is recessed and has a hollow shape on the first surface, and has a surface that continues to the first and second component mounting sections on the second surface,
the detecting element includes a first detecting element and a second detecting element, and the first detecting element is placed on the second surface of the first component mounting section and the second detecting element is placed on the first surface of the first component mounting section,
the detection signal lines are formed at the wiring layer that is a surface layer on the second surface side of the flexible section, and
the first detecting element and the second detecting element are connected to the detection signal lines at the first component mounting section.

5. The electronic control device as claimed in claim 1, wherein:
the flexible section has, as the wiring layers, two layers of the wiring layer as a surface layer of the flexible section and the wiring layer as an internal layer of the flexible section,
a plurality of signal lines including the detection signal lines are formed at the wiring layer of the surface layer, and
a ground line having a width that is larger than a total width of the plurality of signal lines is formed at the wiring layer of the internal layer.

6. The electronic control device as claimed in claim 1, wherein:

the second component mounting section has
the CPU configured to execute arithmetic processing using a detection signal of the detecting element as a parameter and generate a command signal for the electric actuator;
an external sensor input portion configured to input signals from sensors provided outside the electronic control device; and
a communication processing circuit unit configured to carry out communication with other external control devices, and
on the second component mounting section, the external sensor input portion is located at a flexible section side, the communication processing circuit unit is located at an opposite side to the flexible section, and the CPU is located at a middle portion between the external sensor input portion and the communication processing circuit unit.

7. The electronic control device as claimed in claim 1, wherein:
the first component mounting section has a first power terminal, the first power terminal is located at a side edge portion of the first component mounting section and also located at an outer side with respect to the electronic component group forming the control system, and
the second component mounting section has second power terminals at a side edge portion of the second component mounting section, and a second component mounting section power circuit unit configured to convert a terminal voltage inputted to the second power terminals into an operating voltage for the second component mounting section is provided at an end region, which is an opposite side to the flexible section, of the second component mounting section.

8. The electronic control device as claimed in claim 7, wherein:
the second component mounting section has a cutting portion at a position of the side edge portion which faces the first power terminal with the multilayer wiring board being folded, and
the second power terminals are arranged at positions along the cutting portion.

9. The electronic control device as claimed in claim 1, wherein:
the second component mounting section has second power terminals configured to supply power to the second component mounting section, and the second power terminals are located at a side edge portion of the second component mounting section,
the CPU is mounted on a first surface of the second component mounting section, and
a second component mounting section power circuit unit configured to convert a terminal voltage inputted to the second power terminals into an operating voltage for the second component mounting section is mounted at an end region, which is an opposite side to the flexible section, of the second component mounting section on a second surface of the second component mounting section.

10. The electronic control device as claimed in claim 1, wherein:
the first component mounting section has a first power terminal having a positive electrode and a negative electrode,
the first power terminal is located at a side edge portion of the first component mounting section and also located at an outer side with respect to the electronic component group forming the control system,
the positive electrode and the negative electrode are arranged along the direction of the detection signal lines, and the positive electrode is positioned at a flexible section side with respect to the negative electrode, and
power shutdown switching elements configured to be able to interrupt power supplied from the first power terminal to the electronic component group are provided between the electronic component group and the flexible section.

11. The electronic control device as claimed in claim 1, wherein:
the second component mounting section has
the CPU configured to execute arithmetic processing using a detection signal of the detecting element as a parameter and generate a command signal for the electric actuator; and
a pre-driver circuit element configured to convert the command signal into a control signal for a drive circuit configured to drive the electric actuator, and
the CPU, the pre-driver circuit element and a filter component and a sub-capacitor which are included in the electronic component group are mounted on a same surface of the multilayer wiring board.

12. An electronic control device for driving and controlling an electric actuator having two drive units comprising:
a multilayer wiring board having a plurality of wiring layers and insulating layers that insulate the wiring layers, and wherein
the multilayer wiring board has
first and second component mounting sections on which electronic components are mounted;
a flexible section located between the first and second component mounting sections, wherein the flexible section has a structure in which the number of the wiring layers of the flexible section is smaller than those of the first and second component mounting sections and a board thickness of the flexible section is relatively thin as compared with the first and second component mounting sections, the flexible section has flexibility that is higher than those of the first and second component mounting sections by the structure of the flexible section;
a detecting element mounted on the first component mounting section and configured to detect an operating state of the electric actuator; and
detection signal lines formed at the wiring layer of the flexible section and configured to send signals of the detecting element from the first component mounting section to the second component mounting section, and
each of two control systems that correspond to the two drive units of the electric actuator is formed by a group of electronic components mounted on the first component mounting section and a CPU mounted on the second component mounting section, and
the detecting element is arranged at the first component mounting section such that the detecting element is sandwiched between rows of the two groups of the electronic components corresponding to the two control systems.

13. The electronic control device as claimed in claim 12, wherein:
the second component mounting section has, for each of the two control systems, the CPU configured to execute arithmetic processing using a detection signal of the detecting element as a parameter and generate a command signal for the electric actuator; and a pre-driver circuit element configured to convert the command signal into a control signal for a drive circuit configured to drive the electric actuator, and the CPU, the pre-driver circuit element and the electronic component group of the first component mounting section all belonging to each of the two control systems are arranged along a direction of an imaginary line that passes through a middle of the flexible section and the detecting element, and an output signal of the pre-driver circuit element is sent to a first component mounting section side through lines of the flexible section.

14. The electronic control device as claimed in claim 12, wherein:

the detection signal lines are formed at one of the wiring layers of the flexible section, control signal lines that send control signals from the second component mounting section to the first component mounting section are formed at the same wiring layer as the detection signal lines for each control system, and the control signal lines of the two control systems are arranged at both sides of the detection signal lines.

15. The electronic control device as claimed in claim 12, wherein:

the multilayer wiring board has a first surface and a second surface, the detecting element is mounted on the second surface of the first component mounting section, and the two electronic component groups each forming the control system are mounted on the first surface of the first component mounting section, and when projecting the first component mounting section onto a plane, the detecting element is positioned such that the detecting element is sandwiched between a certain electronic component of the one control system and an electronic component, which has the same function as the certain electronic component, of the other control system, and such that the detecting element does not overlap these two electronic components.

16. The electronic control device as claimed in claim 12, wherein:

the detecting element is used for the two control systems, and a detection signal of the detecting element is branched into the two systems at the first component mounting section, and inputted to each of the control systems through the detection signal lines of the flexible section.

* * * * *